US012796364B2

(12) United States Patent
Park

(10) Patent No.: US 12,796,364 B2
(45) Date of Patent: Nov. 10, 2026

(54) METHODS OF MANUFACTURING SEMICONDUCTOR DEVICES

(71) Applicant: SK hynix Inc., Gyeonggi-do (KR)

(72) Inventor: Jun Beom Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 495 days.

(21) Appl. No.: 18/447,303

(22) Filed: Aug. 10, 2023

(65) Prior Publication Data

US 2024/0332030 A1 Oct. 3, 2024

(30) Foreign Application Priority Data

Mar. 27, 2023 (KR) ........................ 10-2023-0039903

(51) Int. Cl.
*H10P 50/00* (2026.01)
*H10W 20/00* (2026.01)

(52) U.S. Cl.
CPC .............. *H10P 50/73* (2026.01); *H10P 50/71* (2026.01); *H10W 20/056* (2026.01)

(58) Field of Classification Search
CPC ........... H01L 21/3114; H01L 21/32139; H01L 21/76877; H10W 20/056; H10W 20/0595; H10P 50/71; H10P 50/73
See application file for complete search history.

(56) References Cited

U.S. PATENT DOCUMENTS

| | | | | |
|---|---|---|---|---|
| 8,293,603 | B2 | 10/2012 | Cho et al. | |
| 2015/0235868 | A1* | 8/2015 | Chang | H01L 21/02164 438/593 |
| 2020/0075319 | A1* | 3/2020 | Chang | H01L 21/31144 |

FOREIGN PATENT DOCUMENTS

| | | |
|---|---|---|
| KR | 10-2008-0060344 A | 7/2008 |

* cited by examiner

*Primary Examiner* — Latanya N Crawford Eason
(74) *Attorney, Agent, or Firm* — IP & T GROUP LLP

(57) ABSTRACT

A method of manufacturing a semiconductor device in which a conductive layer is formed over a semiconductor substrate, and a hard mask layer is formed. Some portions of the hard mask layer are selectively removed to form first patterns of the hard mask layer and a second pattern of the hard mask layer. A first shielding pattern that shields a first region of the semiconductor substrate is formed, and the portions of the conductive layer, exposed by the first shielding pattern and the second pattern of the hard mask layer are selectively removed to form a first conductive line pattern. A second shielding pattern that shields a second region of the semiconductor substrate is formed, and other portions of the conductive layer, exposed by the second shielding pattern and the first patterns of the hard mask layer are selectively removed to form second conductive line patterns.

23 Claims, 18 Drawing Sheets

METHODS OF MANUFACTURING SEMICONDUCTOR DEVICES

CROSS-REFERENCE TO RELATED APPLICATIONS

The present application claims priority under 35 U.S.C. 119(a) to Korean Application No. 10-2023-0039903, filed on Mar. 27, 2023, which is incorporated herein by reference in its entirety.

BACKGROUND

1. Technical Field

The present disclosure generally relates to integrated circuit devices and, more particularly, to methods of manufacturing semiconductor devices including conductive patterns.

2. Related Art

Integrated circuit elements may be integrated on a semiconductor substrate to form semiconductor devices. As design rules required for the semiconductor devices change over time, spaces between conductive patterns constituting the integrated circuit elements are decreasing. Conductive patterns having different critical dimensions (CDs) are being formed on semiconductor substrates with different line widths, spacings, and densities.

SUMMARY

One embodiment of the present disclosure may provide a method of manufacturing a semiconductor device including forming a first conductive layer over a semiconductor substrate including a first region and a second region, forming a hard mask layer on the first conductive layer, forming first patterns of the hard mask layer over the first region and a second pattern of the hard mask layer over the second region by selectively etching portions of the hard mask layer, forming a first shielding pattern that shields the first region and opens the second region, forming a first conductive line pattern by selectively removing first portions of the first conductive layer, exposed by the first shielding pattern and the second pattern of the hard mask layer, forming a second shielding pattern that shields the second region and opens the first region, and forming second conductive line patterns by selectively removing second portions of the first conductive layer, exposed by the second shielding pattern and the first patterns of the hard mask layer.

Another embodiment of the present disclosure may provide a method of manufacturing a semiconductor device including forming a first conductive layer over a semiconductor substrate, forming a hard mask layer on the first conductive layer, selectively etching portions of the hard mask layer to form first patterns of the hard mask layer and a second pattern of the hard mask layer, forming a first shielding pattern that shields first portions of the first conductive layer exposed by the first patterns of the hard mask layer and opens second portions of the first conductive layer exposed by the second pattern of the hard mask layer, selectively removing the second portions of the first conductive layer to form a first conductive line pattern, forming a second shielding pattern that shields the first conductive line pattern and opens the first portions of the first conductive layer, and selectively removing the second portions of the first conductive layer to form second conductive line patterns.

DETAILED DESCRIPTION

Figure 1:
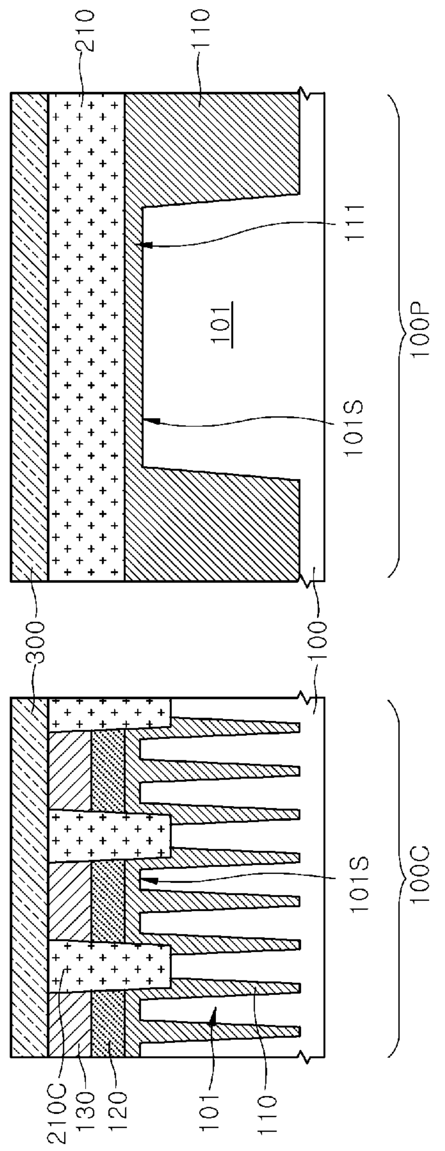
FIGS. 1 to 6 are schematic views illustrating formation of a conductive layer in a method of manufacturing a semiconductor device according to various embodiments of the present disclosure.

The terms used herein may correspond to words selected in consideration of their functions in the presented embodiments. If defined in detail, the terms may be construed according to the definitions. Unless otherwise defined, the terms (including technical and scientific terms) used herein have the plain and ordinary meaning as understood by one of ordinary skill in the art to which the embodiments belong.

In the descriptions in the present disclosure, descriptions such as “first” and “second,” “bottom,” “top,” and “lower” are for distinguishing elements, and are not used to limit the elements themselves or to imply a specific order. These descriptors mean a relative positional relationship, and do not limit a specific case in which another member is further introduced into direct or indirect contact with the element or at an interface between them. The same interpretation may be applied to other expressions describing the relationship between components.

Embodiments of the present disclosure may be applied to technical fields for implementing integrated circuit devices such as for example dynamic random access memory (DRAM) circuits, phase change random access memory (PcRAM) devices, or resistive random access memory (ReRAM) devices. In addition, the embodiments of the present disclosure may be applied to technical fields for implementing memory devices such as for example static random access memory (SRAM) devices, FLASH memory devices, magnetic random access memory (MRAM) devices, or ferroelectric random access memory (FeRAM) devices, or logic devices in which logic circuits are integrated. The embodiments of the present application may be applied (in general) to any technical fields implementing various products requiring fine-sized conductive patterns.

The same reference numerals in this disclosure refer to same devices throughout the specification. Even though a reference numeral might not be mentioned or described with reference to a drawing, the reference numeral may be mentioned or described with reference to another drawing.

In addition, even though a reference numeral might not be shown in a drawing, it may be shown in another drawing.

FIG. 1 is a schematic view illustrating formation of a first conductive layer 300 in a method of manufacturing a semiconductor device according to one embodiment.

Referring to FIG. 1, the first conductive layer 300 may be formed over a semiconductor substrate 100. The first conductive layer 300 may be a layer for a first conductive line pattern and/or a second conductive line pattern. The second conductive line pattern may include a bit line pattern, and the first conductive line pattern may include a gate pattern. The first conductive layer 300 may include a metal layer such as a tungsten (W) layer. The first conductive layer 300 may further include a barrier layer under the metal layer to prevent diffusion or movement of metal ions. The barrier layer may include a layer such as, for example, a titanium (Ti) layer, a tungsten nitride (TiN) layer, or a tungsten silicon nitride (WSiN) layer, or a composite layer thereof.

The first conductive layer 300 may be formed to extend to cover structures formed over a first region 100C and a second region 100P of the semiconductor substrate 100. The first region 100C and the second region 100P of the semiconductor substrate 100 may be regions distinguished from each other. Patterns of different shapes, different densities, or different line widths may be formed over the first region 100C and the second region 100P of the semiconductor substrate 100. The first conductive layer 300 may be separated or patterned into patterns having different shapes, patterns disposed at different densities, patterns having different line widths, or patterns disposed at different spacings in the first region 100C and the second region 100P of the semiconductor substrate 100. In order to provide bit line patterns over the first region 100C of the semiconductor substrate 100, the first conductive layer 300 may extend over the first region 100C of the semiconductor substrate 100. In order to provide a gate pattern over the second region 100P of the semiconductor substrate 100, the first conductive layer 300 may extend over the second region 100P of the semiconductor substrate 100.

The first region 100C of the semiconductor substrate 100 may be a cell region, and the second region 100P of the semiconductor substrate 100 may be a peripheral region. The cell region may be a region in which main circuits constituting a semiconductor device are disposed, and the peripheral region may be a region in which peripheral circuits for operating the main circuits are disposed. In a semiconductor device including a memory device such as a DRAM device, memory elements may be disposed in the cell region, and the peripheral circuits such as, for example, sensing and amplifying circuits may be disposed in the peripheral region. The memory element may include cell transistor elements. Peripheral transistors constituting the peripheral circuits may be disposed in the second region 100P of the semiconductor substrate 100.

The semiconductor substrate 100 may include a semiconductor material such as silicon (Si). The semiconductor substrate 100 may include a semiconductor material such as germanium (Ge). The semiconductor substrate 100 may include a compound semiconductor material such as, for example, silicon carbide (SiC), gallium arsenide (GaAs), indium arsenide (InAs), or indium phosphorus (InP). The semiconductor substrate 100 may have a wafer shape.

Connection elements for connecting the first conductive layer 300 and the semiconductor substrate 100 to each other may be disposed under the first conductive layer 300. Bit line plugs 210C may be disposed as conductive elements electrically connecting the first conductive layer 300 and some portions of the semiconductor substrate 100 to each other. The first conductive layer 300 may be formed over the semiconductor substrate 100 to be connected to the bit line plugs 210C.

The bit line plugs 210C may be positioned over the first region 100C of the semiconductor substrate 100. The bit line plugs 210C may have shapes in which some portions of the bit line plugs 210C penetrate into some portions of the semiconductor substrate 100 in the first region 100C. The bit line plugs 210C may have shapes in which some portions of the bit line plugs 210C are infiltrated into some portions of the semiconductor substrate 100 in the first region 100C. The shapes of the bit line plugs 210C, in which some portions of the bit line plugs 210C infiltrate into some portions of the semiconductor substrate 100, may further secure contact surfaces between the bit line plugs 210C and the semiconductor substrate 100, and may be advantageous in improving contact resistance.

The bit line plugs 210C may be connected to some portions of active regions 101 of the semiconductor substrate 100 of the first region 100C. The active regions 101 of the semiconductor substrate 100 may be regions partitioned by device isolation layers 110 formed in the semiconductor substrate 100. The active regions 101 positioned in the first region 100C of the semiconductor substrate 100 may each have a narrower width than other active regions 101 formed in the second region 100P. The device isolation layers 110 positioned in the first region 100C of the semiconductor substrate 100 may each have a narrower width than other device isolation layers 110 formed in the second region 100P. Each of the device isolation layers 110 may include silicon oxide ($SiO_2$) or silicon nitride ($Si_3N_4$) layer. The device isolation layer 110 positioned in the second region 100P of the semiconductor substrate 100 may be formed as a composite layer including a silicon oxide ($SiO_2$) layer and a silicon nitride ($Si_3N_4$) layer.

A second conductive layer 210 may be further formed between the first conductive layer 300 and the second region 100P of the semiconductor substrate 100. The second conductive layer 210 may be formed as a layer constituting peripheral gate patterns for the peripheral transistors constituting the peripheral circuits in the second region 100P of the semiconductor substrate 100, together with the first conductive layer 300. The second conductive layer 210 may also be formed over the first region 100C of the semiconductor substrate 100 to form the bit line plugs 210C. The bit line plugs 210C may be patterns formed by being separated from some portions of the second conductive layer 210, extending over the first region 100C of the semiconductor substrate 100.

A gate dielectric layer 111 may be disposed between the second conductive layer 210 and the second region 100P of the semiconductor substrate 100. The gate dielectric layer 111 may be a dielectric layer covering a surface 101S of the semiconductor substrate 100 positioned in the second region 100P of the semiconductor substrate 100. The gate dielectric layer 111 may include a silicon oxide ($SiO_2$) layer. A first dielectric layer 120 and a second dielectric layer 130 may be disposed between the first conductive layer 300 and the first region 100C of the semiconductor substrate 100. The first dielectric layer 120 and the second dielectric layer 130 may electrically isolate the active regions 101 of the semiconductor substrate 100 from the first conductive layer 300 in the first region 100C. The first dielectric layer 120 and the second dielectric layer 130 may be formed of different dielectric materials. The first dielectric layer 120 may be formed of silicon oxide, and the second dielectric layer 130 may be formed of silicon nitride. The bit line plugs 210C may be formed to penetrate the first dielectric layer 120 and the second dielectric layer 130.

FIGS. 2 to 6 are views schematically illustrating for forming the first conductive layer 300 of FIG. 1 over the semiconductor substrate 100. The processings shown in FIGS. 2 to 6 present a procedure for forming a lower structure on which the first conductive layer 300 of FIG. 1 is formed. Forming the lower structure on which the first conductive layer 300 is formed is not limited to these processings.

Figure 2:
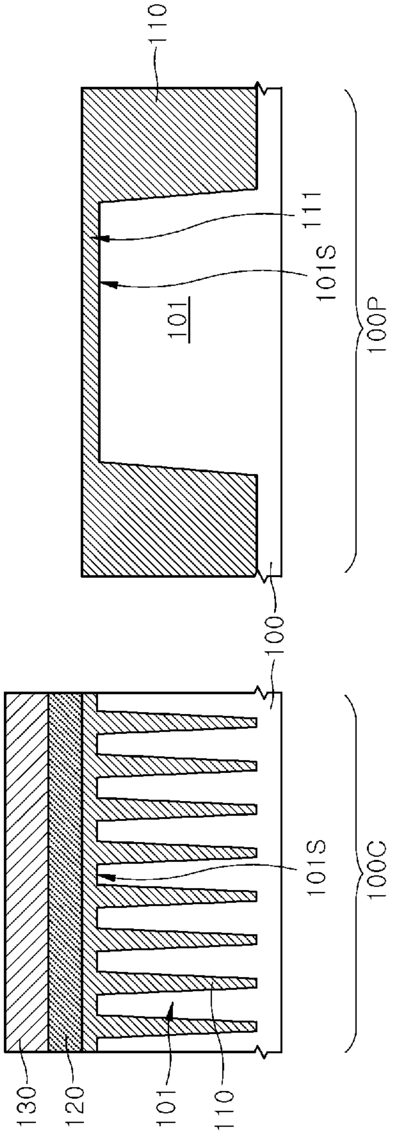

Referring to FIG. 2, the device isolation layers 110 may be formed on the first region 100C and the second region 100P of the semiconductor substrate 100 to partition the active regions 101. The first dielectric layer 120 and the second dielectric layer 130 may be formed over the first region 100C of the semiconductor substrate 100.

Figure 3:
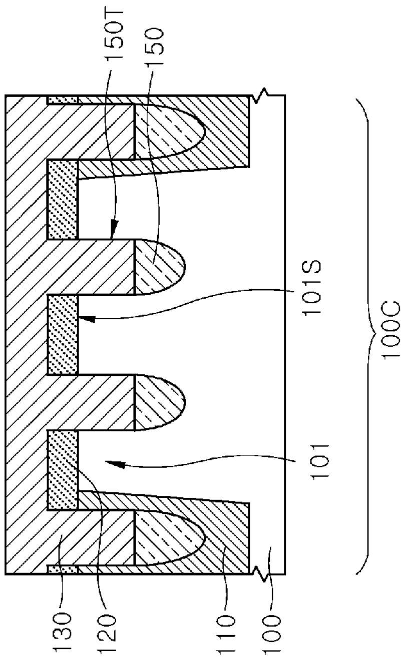

Referring to FIG. 3, buried gate patterns 150 may be formed in the semiconductor substrate 100. FIG. 3 shows a cross-sectional shape obtained by cutting the first region 100C of the semiconductor substrate 100 in a direction different from that of FIG. 2. FIG. 3 shows a cross section crossing a plurality of neighboring buried gate patterns 150. The buried gate patterns 150 may be formed to extend while crossing bit line patterns to be separated from the first conductive layer (layer 300 in FIG. 1).

The buried gate patterns 150 may constitute cell transistors, together with the bit line patterns. Some portions of the first region 100C of the semiconductor substrate 100 may be recessed to form recess portions 150T in which the buried gate patterns 150 are to be formed. When the portions of the first region 100C of the semiconductor substrate 100 are recessed, the first dielectric layer 120 may open some portions of the semiconductor substrate 100 where the recess portions 150T are to be formed, and cover and protect other portions of the semiconductor substrate 100 which are not to be recessed. Each of the recess portions 150T may be formed in a trench shape. The buried gate patterns 150 containing a conductive material may be formed in the recess portions 150T, and the second dielectric layer 130 may be formed to fill the recess portions 150T while covering the buried gate patterns 150.

Buried gate dielectric layers may be formed at interfaces between the buried gate patterns 150 and the active regions 101 of the semiconductor substrate 100. As the buried gate patterns 150 are buried in the semiconductor substrate 100, the buried gate patterns 150 may be positioned lower than the surface 101S of the semiconductor substrate 100, and a longer channel length or a longer length between source and drain regions of the cell transistor may be secured. The source region and the drain region may be formed by doping the active regions 101 of the semiconductor substrate 100 in the first region 100C with impurities.

Figure 4:
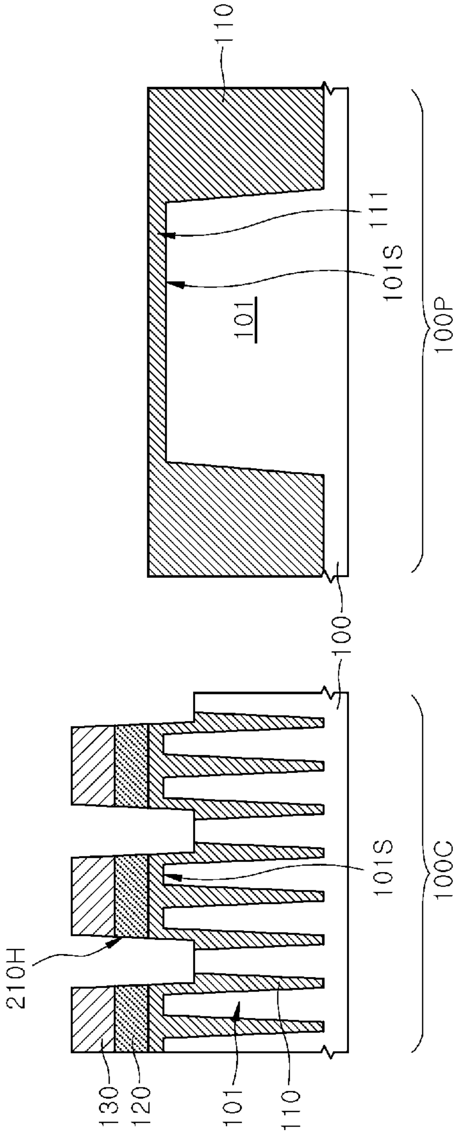

Referring to FIG. 4, some portions of the semiconductor substrate 100 positioned in the first region 100C of the semiconductor substrate 100 may be recessed to form plug holes 210H extending into some active regions 101 of the semiconductor substrate 100. The plug holes 210H may be provided to form the bit line plugs 210C of FIG. 1. The plug holes 210H may be formed to substantially penetrate the first and second dielectric layers 120 and 130 and further extend below the surface 101S of the semiconductor substrate 100. Bottoms of the plug holes 210H may be positioned lower than the surface 101S of the semiconductor substrate 100.

Figure 5:
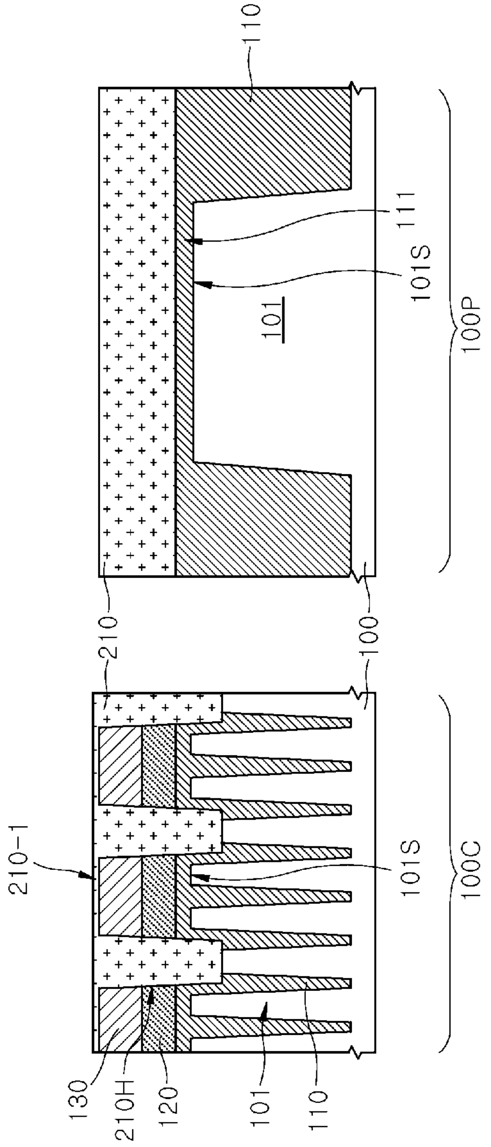

Referring to FIG. 5, the second conductive layer 210 may be formed over the semiconductor substrate 100. The second conductive layer 210 may be formed over the second region 100P and the first region 100C of the semiconductor substrate 100. The second conductive layer 210 may be formed of a different conductive material from the first conductive layer 300 of FIG. 1. The second conductive layer 210 may include doped polycrystalline silicon. The second conductive layer 210 may extend to fill the plug holes 210H in the first region 100C of the semiconductor substrate 100. The second conductive layer 210 may extend to cover the gate dielectric layer 111 while directly contacting the gate dielectric layer 111 in the second region 100P of the semiconductor substrate 100. Some portions 210-1 of the second conductive layer 210 may extend to cover the second dielectric layer 130 while directly contacting the second dielectric layer 130 in the first region 100C of the semiconductor substrate 100.

Figure 6:
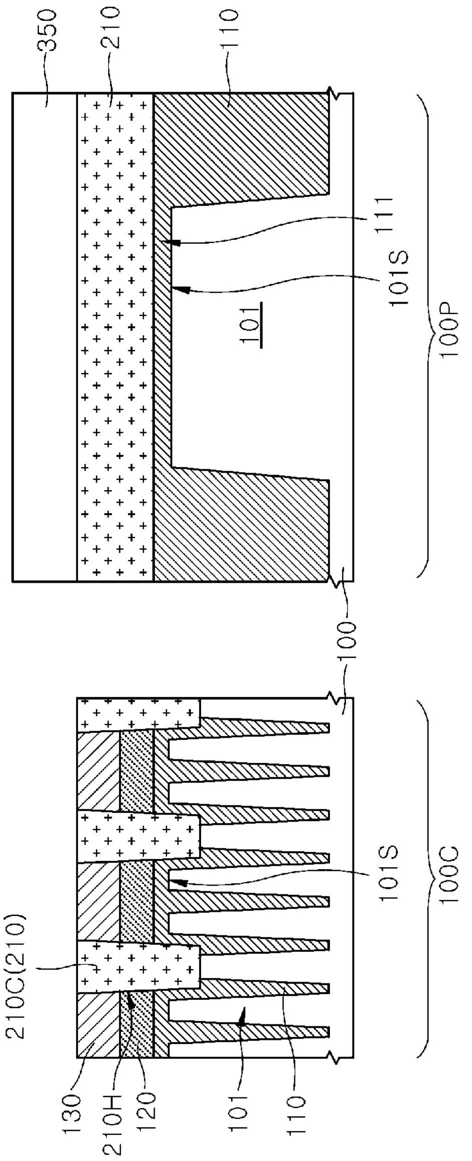

Referring to FIGS. 5 and 6, the portions 210-1 of the second conductive layer 210 may be removed to form the bit line plugs 210C separated from each other. The bit line plugs 210C may be separated from the second conductive layer 210 to fill the plug holes 210H. The first conductive layer 300 of FIG. 1 may be formed on a resultant structure in which the bit line plugs 210C are formed.

After the portions 210-1 of the second conductive layer 210 (shown in FIG. 5) are removed, a third shielding pattern 350 (shown in FIG. 6) may be formed to open the first region 100C of the semiconductor substrate 100 while shielding the second region 100P of the semiconductor substrate 100. The third shielding pattern 350 may cover a portion of the second conductive layer 210 positioned in the second region 100P of the semiconductor substrate 100 to protect the portion from an etch process for removing the portions 210-1 of the second conductive layer 210. The third shielding pattern 350 may include a resist material. The third shielding pattern 350 may include a resist material for argon fluoride (ArF), that may be exposed by ArF light.

Figure 7:
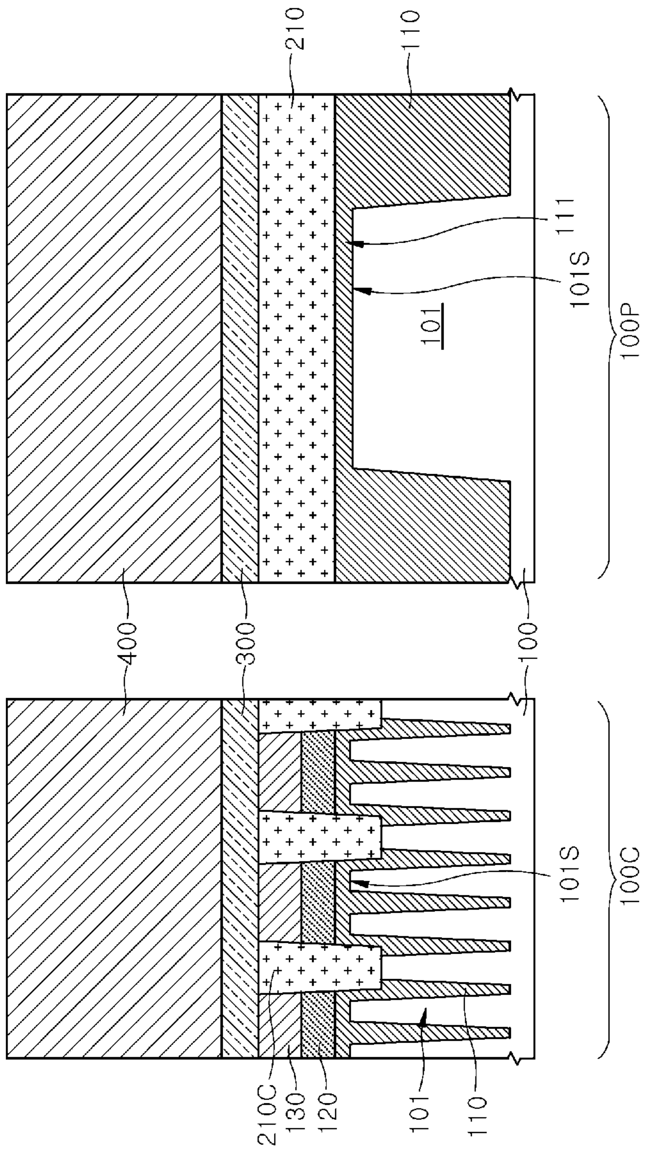
FIG. 7 is a schematic view illustrating formation of a hard mask layer in the method of manufacturing a semiconductor device according to an embodiment of the present disclosure.

FIG. 7 is a schematic view illustrating formation of a hard mask layer 400 in the method of manufacturing a semiconductor device according to one embodiment.

Referring to FIG. 7, the hard mask layer 400 may be formed on the first conductive layer 300. The hard mask layer 400 may be formed as a layer that covers and protects the first conductive layer 300. The hard mask layer 400 may be formed as a layer that blocks diffusion of metal ions from a metal layer such as tungsten (W) layer, constituting the first conductive layer 300. The hard mask layer 400 may include a dielectric material such as silicon nitride ($Si_3N_4$).

Figure 8:
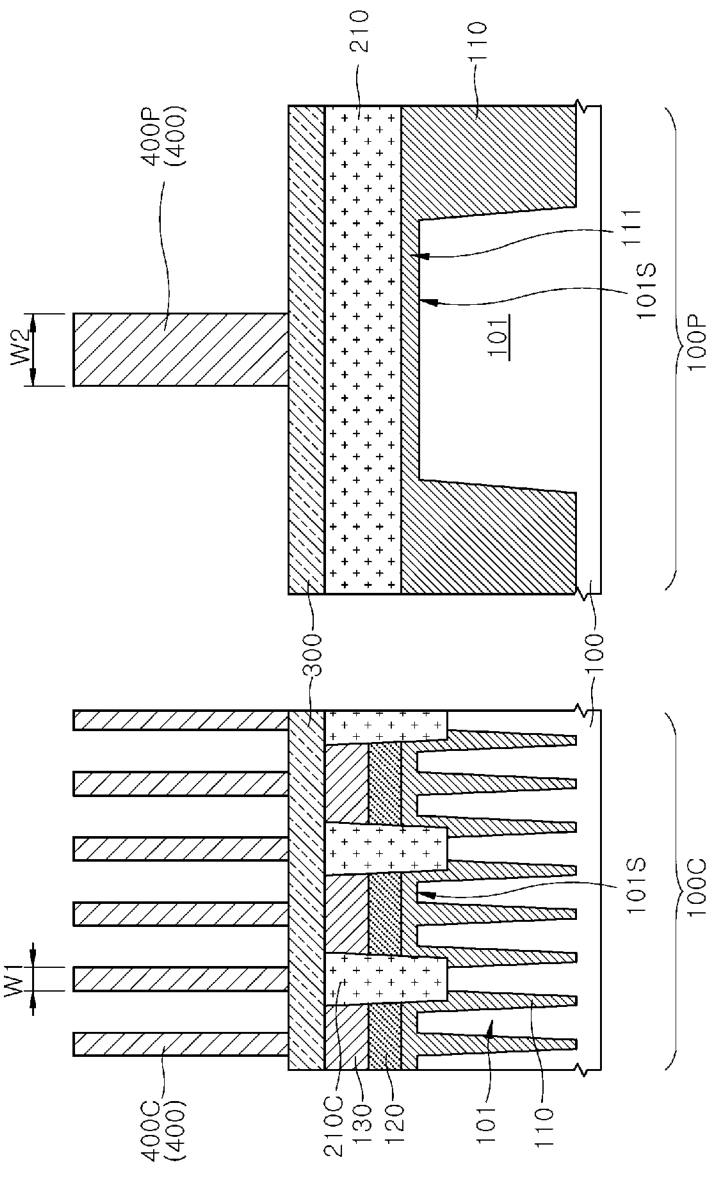
FIGS. 8 to 12 are schematic views illustrating formation of patterns of the hard mask layer in the method of manufacturing a semiconductor device according to various embodiments of the present disclosure.

FIG. 8 is a schematic view illustrating formation of first patterns 400C and a second pattern 400P of the hard mask layer 400 in the method of manufacturing a semiconductor device according to one embodiment.

Referring to FIGS. 7 and 8, some portions of the hard mask layer 400 may be selectively removed to form the first patterns 400C of the hard mask layer and the second pattern 400P of the hard mask layer. The hard mask layer 400 may be patterned so that the first patterns 400C of the hard mask layer are positioned over the first region 100C of the semiconductor substrate 100, and the second pattern 400P of the hard mask layer is positioned over the second region 100P of the semiconductor substrate 100. A line width W1 of each of the first patterns 400C of the hard mask layer may be smaller than a line width W2 of the second pattern 400P of the hard mask layer. The first patterns 400C of the hard mask layer may have higher density than the second pattern 400P of the hard mask layer.

FIGS. 9 to 12 are views schematically illustrating for forming the first patterns 400C and the second pattern 400P of the hard mask layer of FIG. 8. The processings shown in FIGS. 9 to 12 present one method of implementing the first patterns 400C and the second pattern 400P of the hard mask layer of FIG. 8. Forming the first patterns 400C and the second pattern 400P of the hard mask layer is not limited to these processings.

Figure 9:
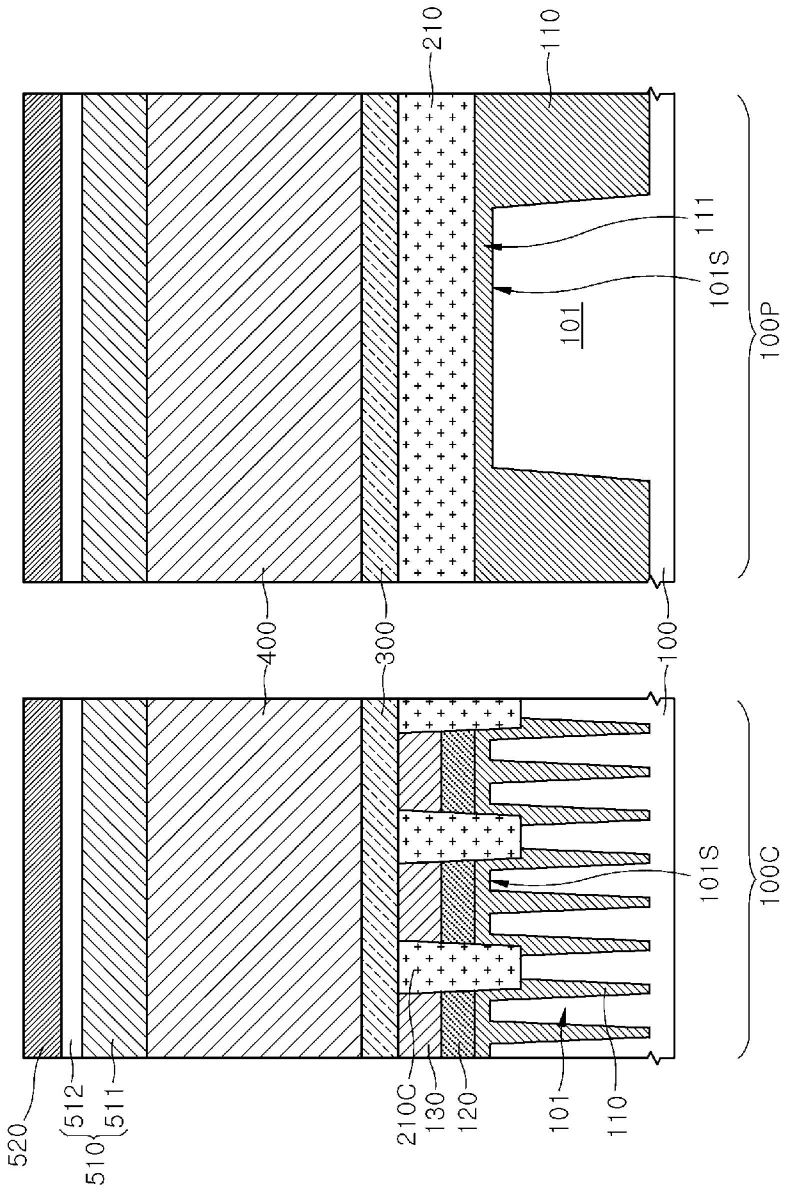

Referring to FIG. 9, a resist layer 520 may be formed over the hard mask layer 400. A resist underlayer 510 may be further formed between the hard mask layer 400 and the resist layer 520. The resist layer 520 may include a resist material for extreme ultraviolet (EUV) lithography process.

The resist underlayer 510 may include a dielectric material. The resist underlayer 510 may include a double layer of a first underlayer 511 and a second underlayer 512. The first underlayer 511 may include a carbon layer. The carbon layer may be formed through a spin on carbon (SOC) process. The carbon layer may include an amorphous carbon layer. The second underlayer 512 may be formed as a dielectric layer that isolates the carbon layer and the resist layer 520 from each other. The second underlayer 512 may prevent the resist layer 520 from being undesirably contaminated by mixing carbon of the carbon layer with a resist material constituting the resist layer 520. The second underlayer 512 may include a dielectric layer containing silicon (Si). The second underlayer 512 may include an oxide containing silicon (Si) or a nitride containing silicon (Si). The dielectric layer containing silicon (Si) may be a layer including silicon oxynitride (SiON).

Figure 10:
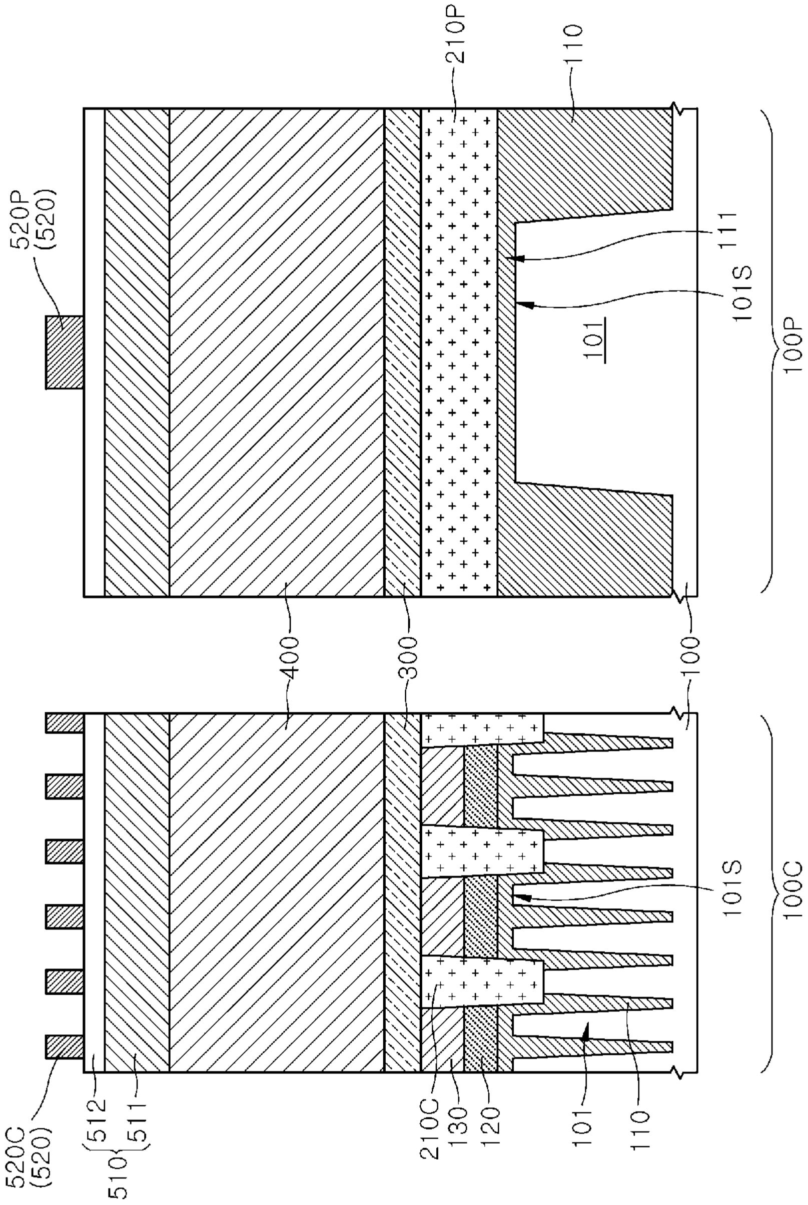

Referring to FIGS. 9 and 10, the resist layer 520 may be exposed and developed to form resist patterns 520C and 520P. Some portions of the resist layer 520 may be exposed using extreme ultraviolet (EUV) light, and the exposed portions may be developed and removed from the resist layer 520. By exposing the resist layer 520 through a lithography process using for example extreme ultraviolet (EUV), the resist patterns 520C and 520P may be formed as patterns having minute line widths.

The resist patterns 520C and 520P may be formed to provide the shapes of the first patterns 400C of the hard mask layer and the second pattern 400P of the hard mask layer of FIG. 8. The resist patterns 520C and 520P may include the first resist patterns 520C and the second resist pattern 520P. The first resist patterns 520C may be positioned over the first region 100C of the semiconductor substrate 100 and formed in patterns having a minute line width. The first resist patterns 520C may provide the shapes of the first patterns 400C of the hard mask layer, and the second resist pattern 520P may provide the shape of the second pattern 400P of the hard mask layer. The second resist pattern 520P may be positioned over the second region 100P of the semiconductor substrate 100.

Figure 11:
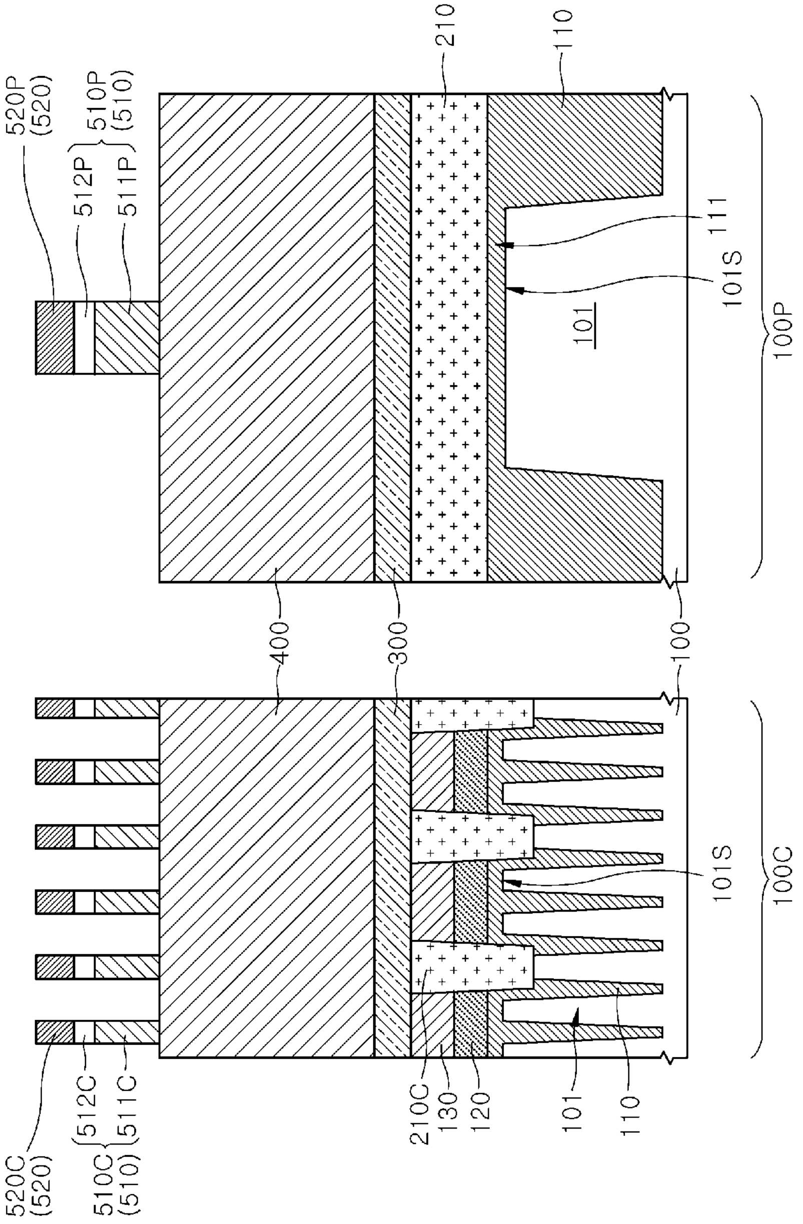

Referring to FIGS. 10 and 11, resist underlayer patterns 510C and 510P may be formed through a selective etching process using the resist patterns 520C and 520P as etch masks. The selective etching process may be performed to selectively remove some portions of the resist underlayer 510, exposed by the resist patterns 520C and 520P. The portions of the resist underlayer 510 may be selectively etched and removed, and the shapes of the resist patterns 520C and 520P may be transferred to the resist underlayer patterns 510C and 510P. The resist underlayer patterns 510C and 510P may include resist underlayer first patterns 510C and a resist underlayer second pattern 510P. The resist underlayer first patterns 510C may be configured in a stack structure of a first underlayer first pattern 511C and a second underlayer first pattern 512C, and the resist underlayer second pattern 510P may be configured in a stack structure of a first underlayer second pattern 511P and a second underlayer second pattern 512P.

Figure 12:
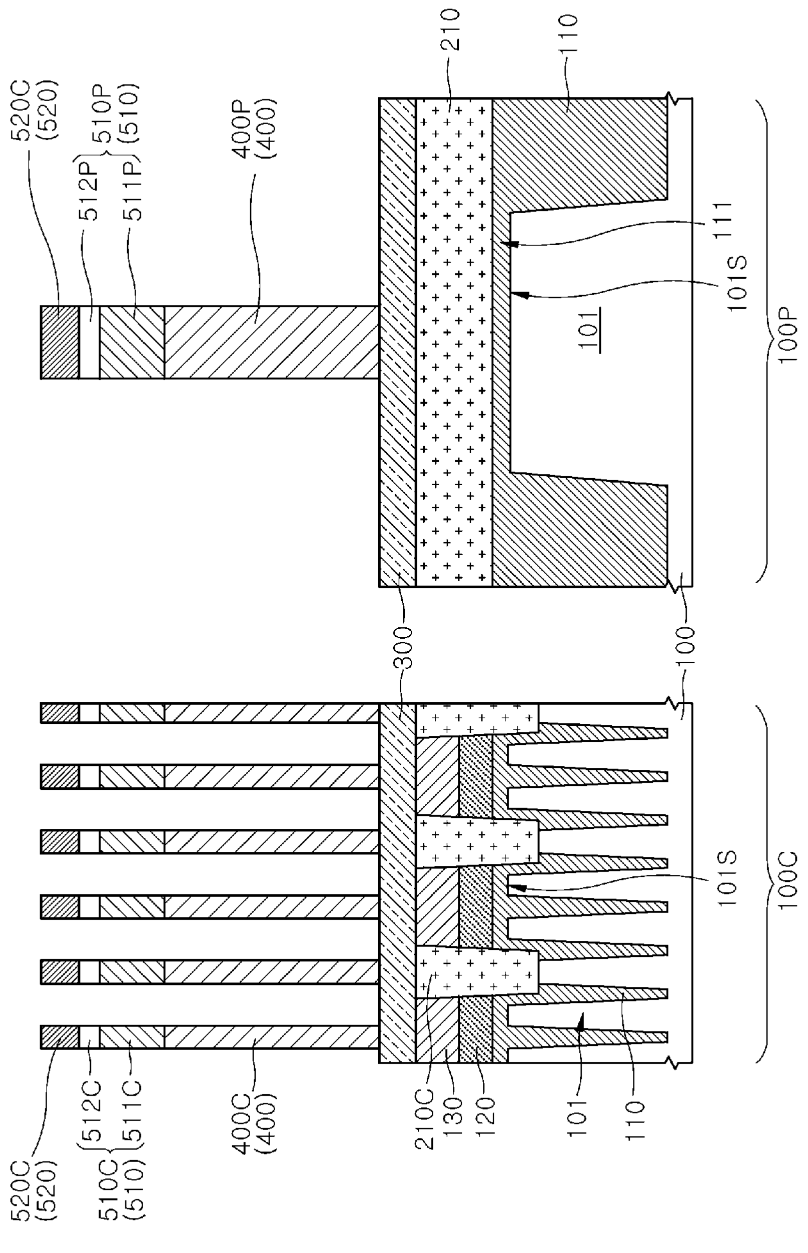

Referring to FIGS. 11 and 12, through another selective etching process using the resist patterns 520C and 520P and the resist underlayer patterns 510C and 510P as etch masks, the hard mask layer 400 may be patterned. The shapes of the resist patterns 520C and 520P may be pattern-transferred to the first patterns 400C of the hard mask layer and the second pattern 400P of the hard mask layer. Some portions of the hard mask layer 400 exposed through the resist underlayer patterns 510C and 510P may be selectively etched and removed, so that the first patterns 400C of the hard mask layer and the second pattern 400P of the hard mask layer, in which the shapes of the resist underlayer patterns 510C and 510P are pattern-transferred, may be formed.

After forming the first patterns 400C of the hard mask layer and the second pattern 400P of the hard mask layer, the resist underlayer patterns 510C and 510P may be removed while removing the resist patterns 520C and 520P. The resist patterns 520C and 520P may be removed using an ashing process. An $O_2$ plasma may be provided to the resist patterns 520C and 520P, so that the resist material may be removed by the $O_2$ plasma. While the resist patterns 520C and 520P are ashed, the first underlayer first patterns 511C and the first underlayer second pattern 511P may be ashed and removed together. Because the first underlayer first patterns 511C and the first underlayer second pattern 511P are formed of carbon, the first underlayer first patterns 511C and the first underlayer second pattern 511P may be removed by the $O_2$ plasma. As the first underlayer first patterns 511C and the first underlayer second pattern 511P are removed, the second underlayer first patterns 512C and the second underlayer second pattern 512P may also be removed. As the first underlayer first patterns 511C and the first underlayer second pattern 511P are removed, the second underlayer first patterns 512C and the second underlayer second pattern 512P may be lifted-off.

Figure 13:
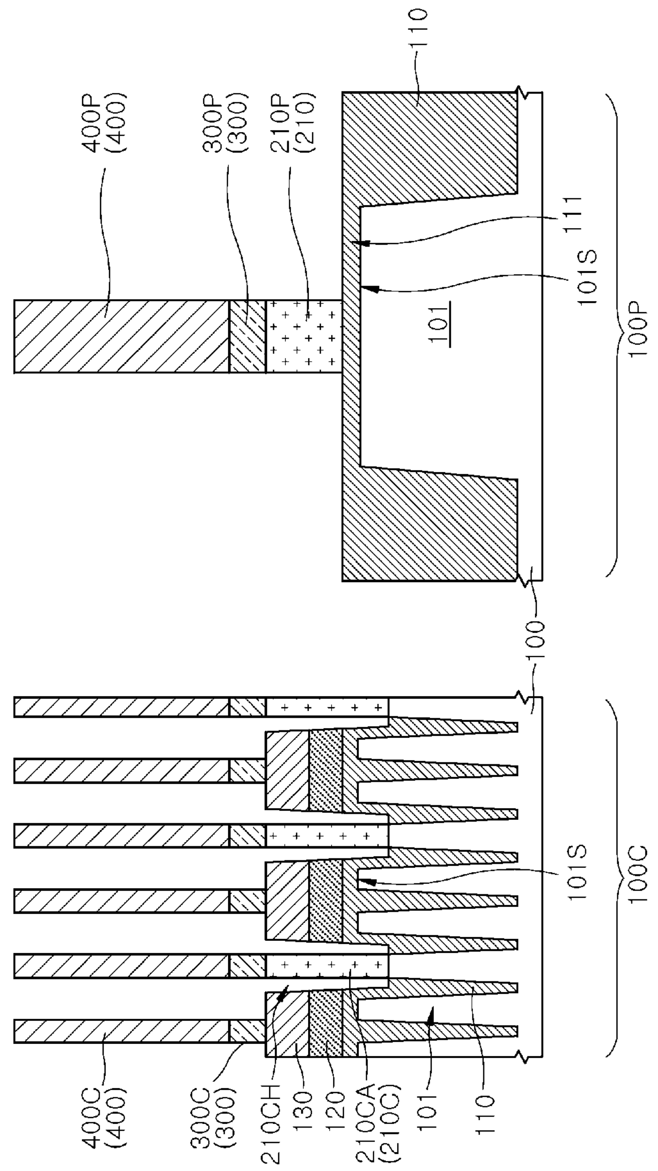
FIGS. 13 to 17 are schematic views illustrating formation of a first conductive line pattern and a second conductive line pattern in the method of manufacturing a semiconductor device according to various embodiments of the present disclosure.

FIG. 13 is a schematic view illustrating formation of bit line patterns 300C and a gate pattern 300P+210P in the method of manufacturing a semiconductor device according to one embodiment. FIGS. 14 to 17 are views schematically illustrating processings which form the bit line patterns 300C and the gate pattern 300P+210P of FIG. 13. The processings shown in FIGS. 14 to 17 present one method of forming the bit line patterns 300C and the gate pattern 300P+210P. Forming the bit line patterns 300C and the gate pattern 300P+210P is not limited to these processings. Each of the bit line patterns 300C may include a second conductive line pattern, and the gate pattern 300P+210P may include first and second conductive line patterns. The gate pattern 300P+210P may include the first gate pattern 300P and the second gate pattern 210P. The first gate pattern 300P may include the first conductive line pattern, and the second gate pattern 210P may include the third conductive line pattern. In the following descriptions, the first gate pattern 300P may indicate the first conductive line pattern, the second gate pattern 210P may indicate the third conductive line pattern, and the bit line pattern 300C may indicate the second conductive line pattern.

Figure 14:
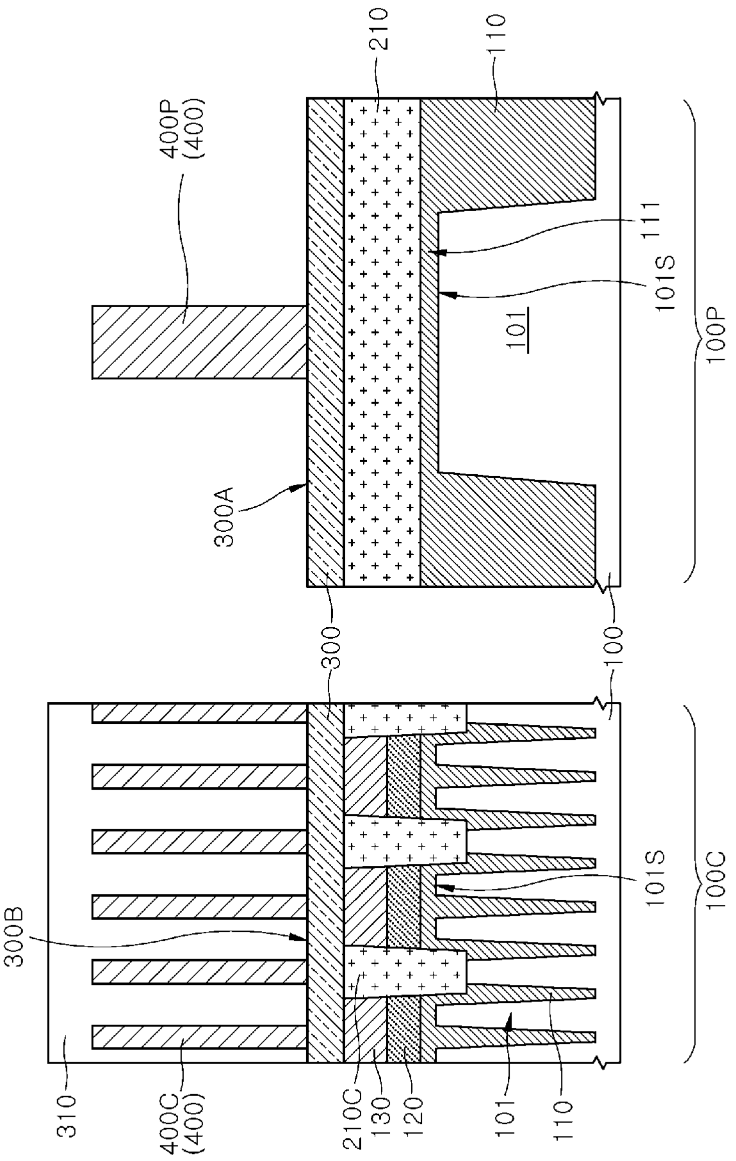

Referring to FIGS. 13 and 14, a first shielding pattern 310 may be formed over the semiconductor substrate 100. In order to form the gate pattern 300P+210P in the second region 100P of the semiconductor substrate 100, the first shielding pattern 310 may be formed over the semiconductor substrate 100 to shield the first region 100C of the semiconductor substrate 100 and to open the second region 100P of the semiconductor substrate 100. The first shielding pattern 310 may be formed to open some portions 300A of the first conductive layer positioned around the second pattern 400P of the hard mask layer. The first shielding pattern 310 may be formed as a pattern that opens and exposes the second pattern 400P of the hard mask layer. The first shielding pattern 310 may be formed to shield other portions 300B of the first conductive layer 310 exposed between the first patterns 400C of the hard mask layer. The first shielding pattern 310 may extend to cover the first patterns 400C of the hard mask layer.

The first shielding pattern 310 may include a resist material different from that of the resist layer 520 of FIG. 9. The first shielding pattern 310 may include a resist material that may be exposed by argon fluoride (ArF) light. A first shielding layer may be formed over the semiconductor substrate 100 to cover the first patterns 400C of the hard mask layer and the second pattern 400P of the hard mask layer, and a portion of the first shielding layer may be selectively exposed and developed, thereby forming the first shielding pattern 310.

Figure 15:
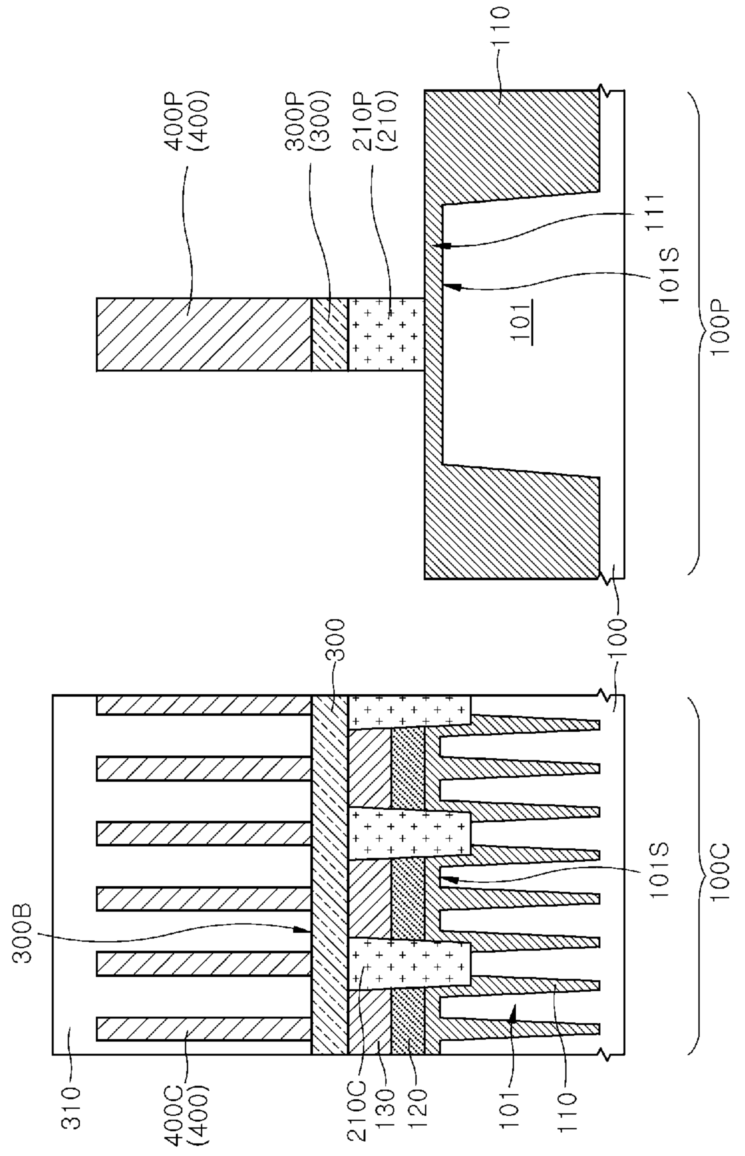

Referring to FIGS. 14 and 15, the gate pattern 300P+210P may be formed over the second region 100P of the semiconductor substrate 100 through a selective etching process using the first shielding pattern 310 and the second pattern 400P of the hard mask as etch masks. The portions 300A of the first conductive layer 300 exposed by the first shielding pattern 310 and the second pattern 400P of the hard mask layer may be selectively etched and removed to form the first gate pattern 300P from the first conductive layer 300. The portions of the second conductive layer 210, exposed while selectively removing the portions 300A of the first conductive layer 300 may be further removed. Accordingly, the second gate pattern 210P overlapping with the first gate pattern 300P may be formed. The gate pattern 300P+210P may be formed in a stack structure in which the first gate pattern 300P overlaps with the second gate pattern 210P. The gate pattern 300P+210P may constitute a peripheral transistor for the peripheral circuit. After forming the gate pattern 300P+210P, the first shielding pattern 310 may be removed.

Figure 16:
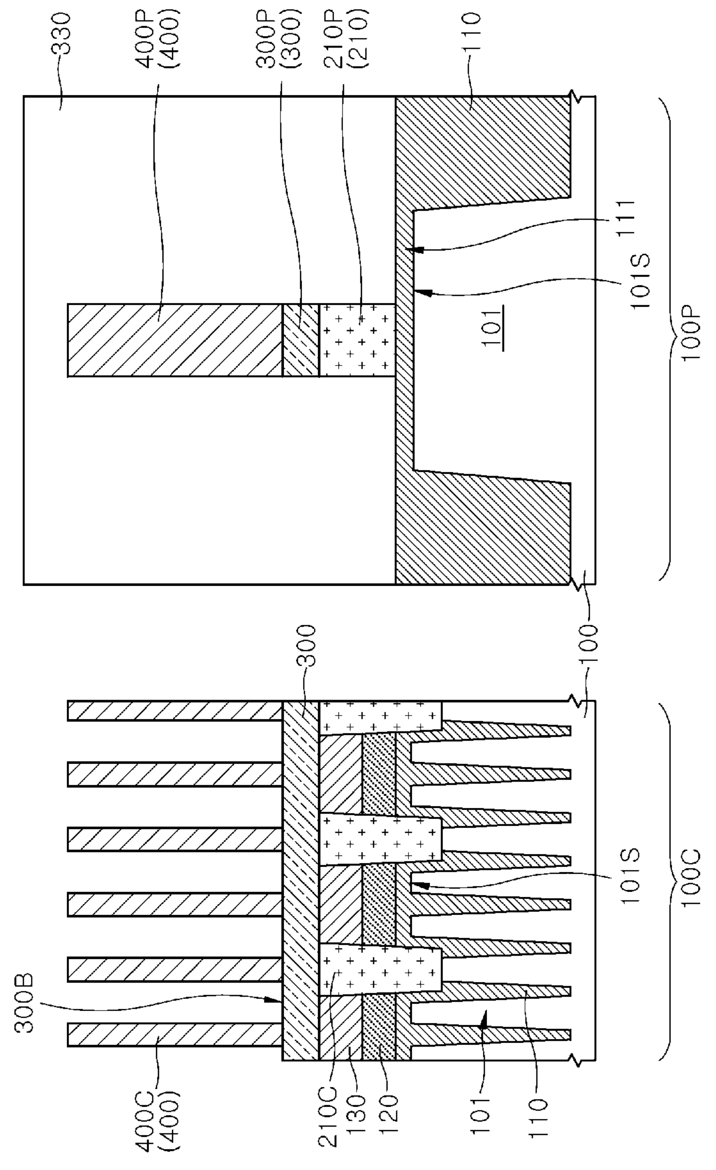

Referring to FIGS. 13 and 16, a second shielding pattern 330 may be formed over the semiconductor substrate 100. In order to form the bit line patterns 300C in the first region 100C of the semiconductor substrate 100, the second shielding pattern 330 may be formed over the semiconductor substrate 100 to shield the second region 100P of the semiconductor substrate 100 and to open and expose the first region 100C of the semiconductor substrate 100. The second shielding pattern 330 may be formed to open and expose the portions 300B of the first conductive layer 300, positioned between the first patterns 400C of the hard mask layer. The second shielding pattern 330 may extend to cover the second pattern 400P of the hard mask layer and the first gate pattern 300P and second gate pattern 210P.

The second shielding pattern 330 may include different material from the resist layer 520 of FIG. 9. The second shielding pattern 330 may include a resist material that may be exposed by argon fluoride (ArF) light. The second shielding pattern 330 may be formed by forming a second shielding layer over the semiconductor substrate 100 to cover the second pattern 400P of the hard mask layer, the first gate pattern 300P, and the second gate pattern 210P, and selectively exposing and developing some portions of the second shielding layer.

Figure 17:
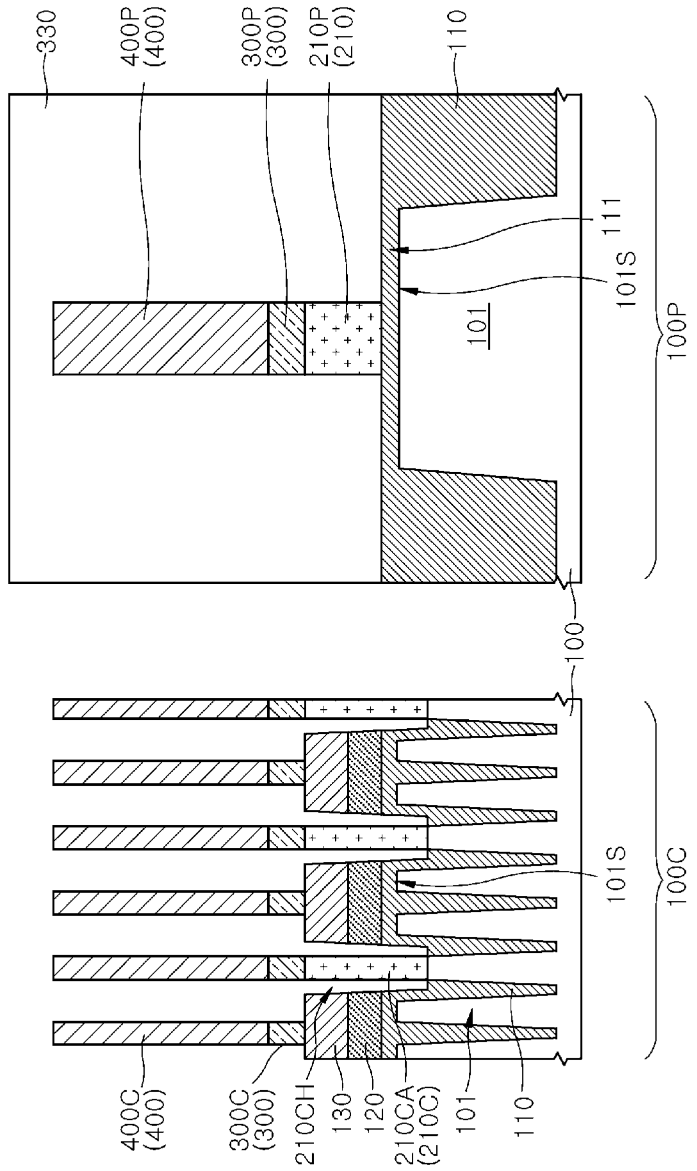

Referring to FIGS. 16 and 17, through a selective etching process using the second shielding pattern 330 and the first patterns 400C of the hard mask layer as etching masks, the bit line patterns 300C may be formed over the first region 100C of the semiconductor substrate 100. The portions 300B of the first conductive layer 300, exposed by the second shielding pattern 330 and the first patterns 400C of the hard mask layer may be selectively etched and removed to separate the bit line patterns 300C from the first conductive layer 300.

Some portions of the bit line plugs 210C, exposed while the portions 300B of the first conductive layer 300 are selectively removed may be further removed. Accordingly, bit line plugs 210CA having a width reduced from the width of the bit line plugs 210C may be formed. As the portions of the bit line plugs 210C are removed, gap portions 210CH may be formed between the bit line plugs 210CA and the first dielectric layer 120 and between the bit line plugs 210CA and the second dielectric layer 130. The first dielectric layer 120 may be formed of silicon nitride substantially the same as that of each of the first patterns 400C of the hard mask layer, and may be substantially maintained without being removed by etching. As the portions of the bit line plugs 210C are removed, the width of the bit line plug 210CA may be reduced to be substantially equal to or similar to the width of the bit line pattern 300C. An insulating layer may fill the gap portions 210CH generated next to the bit line plugs 210CA. After forming the bit line patterns 300C, the second shielding pattern 330 may be removed.

Referring back to FIG. 12, one processing may simultaneously etch and remove some portions of the first conductive layer 300, exposed by the first patterns 400C of the hard mask layer and the second pattern 400P of the hard mask layer using the first patterns 400C of the hard mask layer and the second pattern 400P of the hard mask layer as etch masks. Because the first patterns 400C of the hard mask layer and the second pattern 400P of the hard mask layer have different line widths and are disposed at different densities, different etching loading effects may be applied to the first region 100C and the second region 100P of the semiconductor substrate 100. Due to the difference in the etching loading effects applied in the first region 100C and the second region 100P of the semiconductor substrate 100, etching defects may be caused in the stacks of the bit line patterns 300C and the first patterns 400C of the hard mask layer to be formed in the shapes shown in FIG. 13. A defect in which the stacks of the bit line patterns 300C and the first patterns 400C of the hard mask layer fall over or tilt during the etching process or the subsequent cleaning process may be caused.

In the present disclosure, the etch forming of the gate pattern 300P+210P using the first shielding pattern 310 as shown in FIG. 15 and the etch forming of the bit line patterns 300C using the second shielding pattern 330 as shown in FIG. 17 may be performed separately from each other. Accordingly, it is possible to effectively suppress or reduce a problem in which etching defects are caused due to different etching loading effects according to the regions 100C and 100P. After the etch forming of the bit line patterns 300C using the second shielding pattern 330 and the first patterns 400C of the hard mask layer as shown in FIG. 17, an etch forming of the gate patterns 300P+210P may be performed using the first shielding pattern 310 as shown in FIG. 15.

Figure 18:
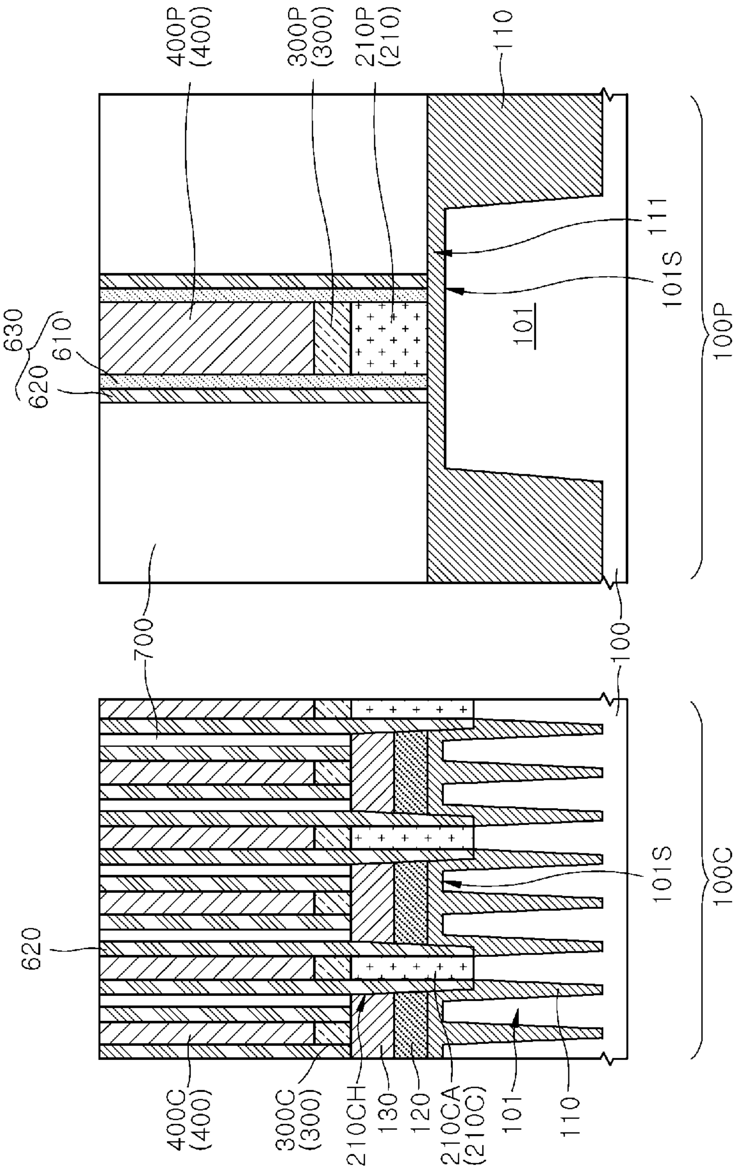
FIG. 18 is a schematic view illustrating formation of spacers in the method of manufacturing a semiconductor device according to an embodiment of the present disclosure.

FIG. 18 is a schematic view illustrating formation of spacers 620 and 630 in the method of manufacturing a semiconductor device according to another embodiment.

Referring to FIGS. 17 and 18, a first spacer 610 may be formed on a side of the stack structure including the first and second gate patterns 300P and 210P and the second pattern 400P of the hard mask layer. The second spacers 620 may be formed on sides of the stack structures including the bit line patterns 300C and the first patterns 400C of the hard mask layer. While forming the second spacers 620 on the sides of the stack structures including the bit line patterns 300C and the first patterns 400C of the hard mask layer, the second spacer 620 may also be formed on the side of the first spacer 610. An overlapping spacer 630 in which the first spacer 610 and the second spacer 620 overlap may be formed on the side of the first and second gate patterns 300P and 210P and the second pattern 400P of the hard mask layer. The second spacers 620 may extend to fill the gap portions 210CH formed on the sides of the bit line plugs 210CA. Because the sides of the bit line plugs 210CA are blocked by the second spacers 620, unwanted connection defects between the bit line plugs 210CA and other conductive elements may be suppressed.

Thereafter, an insulating layer 700 (as shown in FIG. 18) covering the first and second gate patterns 300P and 210P, the second pattern 400P of the hard mask layer, and the overlapping spacer 630 may be formed. The insulating layer 700 may extend to fill between the second spacers 620.

The inventive concept has been disclosed in conjunction with the embodiments described above. Those skilled in the art will recognize that various modifications, additions and substitutions are possible, without departing from the scope of the present disclosure. Accordingly, the embodiments disclosed in the present specification should be considered from not a restrictive standpoint but rather an illustrative standpoint. The scope of the inventive concept is not limited to the above descriptions, and all of distinctive features of an equivalent scope should be construed as being included in the inventive concept.

What is claimed is:

1. A method of manufacturing a semiconductor device, the method comprising:

forming a first conductive layer over a semiconductor substrate including a first region and a second region;

forming a hard mask layer on the first conductive layer;

forming first patterns of the hard mask layer over the first region and a second pattern of the hard mask layer over the second region by selectively etching portions of the hard mask layer;

forming a first shielding pattern that shields the first region and opens the second region;

forming in the second region a first conductive line pattern by selectively removing first portions of the first conductive layer, exposed by the first shielding pattern and the second pattern of the hard mask layer;

forming a second shielding pattern that shields the second region and opens the first region; and forming in the first region second conductive line patterns by selectively removing second portions of the first conductive layer, exposed by the second shielding pattern and the first patterns of the hard mask layer and the second shielding pattern, wherein the first patterns of the hard mask layer cover the second conductive line patterns respectively.

2. The method of claim 1, wherein forming the first patterns of the hard mask layer and the second pattern of the hard mask layer includes:

forming a resist layer on the hard mask layer;

exposing and developing the resist layer to form a resist pattern; and patterning the hard mask layer to transfer a pattern shape of the resist pattern both to the first patterns of the hard mask layer and to the second pattern of the hard mask layer.

3. The method of claim 2, wherein the resist pattern is formed to provide shapes for the first patterns of the hard mask layer and for the second pattern of the hard mask layer.

4. The method of claim 2, wherein exposing the resist layer includes exposing portions of the resist layer using extreme ultraviolet (EUV).

5. The method of claim 2, wherein a resist underlayer is further formed between the hard mask layer and the resist layer, and wherein patterning the hard mask layer includes:

selectively removing portions of the resist underlayer exposed by the resist pattern to form a resist underlayer pattern;

selectively removing the portions of the hard mask layer exposed by the resist underlayer pattern; and removing the resist underlayer pattern.

6. The method of claim 5, wherein the resist underlayer includes:

a carbon layer; and a dielectric layer including silicon (Si) covering the carbon layer.

7. The method of claim 6, wherein the dielectric layer including silicon (Si) includes silicon oxynitride (SiON).

8. The method of claim 2, wherein each of the first and second shielding patterns includes a different resist material from the resist layer.

9. The method of claim 1, wherein each of the first and second shielding patterns includes a resist material that is exposed by argon fluoride (ArF) light.

10. The method of claim 1, wherein the first shielding pattern is formed to shield the second portions of the first conductive layer, exposed between the first patterns of the hard mask layer and to open the first portions of the first conductive layer, positioned around the second pattern of the hard mask layer.

11. The method of claim 10, wherein the first shielding pattern covers the first patterns of the hard mask layer.

12. The method of claim 1, wherein the second shielding pattern is formed to open the second portions of the first conductive layer, exposed by the first patterns of the hard mask layer.

13. The method of claim 12, wherein the second shielding pattern covers the second pattern of the hard mask layer and the first conductive line pattern of the second region.

14. The method of claim 1, further comprising:

forming a second conductive layer between the first conductive layer and the second region of the semiconductor substrate; and forming a third conductive line pattern overlapping with the first conductive line pattern by further removing side-wall portions of the second conductive layer exposed to form a narrower line contact while selectively removing the first portions of the first conductive layer.

15. The method of claim 14, further comprising:

recessing portions of the semiconductor substrate positioned in the first region to form plug holes;

forming the second conductive layer to extend to fill the plug holes; and removing portions of the second conductive layer to form bit line plugs filling the plug holes.

16. The method of claim 15, wherein the second conductive layer includes a conductive material different from that of the first conductive layer.

17. The method of claim 16, wherein the second conductive layer includes doped polycrystalline silicon, and wherein the first conductive layer includes a metal layer including tungsten (W).

18. The method of claim 15, further comprising:

forming first spacers on sides of the first and third conductive line patterns and on sides of the second pattern of the hard mask layer; and forming second spacers on sides of the second conductive line pattern and the first patterns of the hard mask layer and on sides of the first spacers.

19. The method of claim 1, further comprising forming bit line plugs connected to the second conductive line patterns, portions of the bit line plugs penetrating into first portions of the semiconductor substrate positioned in the first region.

20. The method of claim 1, wherein the first conductive line pattern includes a gate pattern, and wherein the second conductive line pattern includes a bit line pattern.

21. The method of claim 1,

Wherein the first shielding pattern shields the first region from device processing in the second region, and Wherein the second shielding pattern shields the second region from device processing in the first region.

22. The method of claim 1, wherein the second conductive line patterns are formed prior to the first conductive line pattern being formed and are protected during the forming the first conductive line pattern by the first shielding pattern.

23. A method of manufacturing a semiconductor device, the method comprising:

forming a first conductive layer over a semiconductor substrate;

forming a hard mask layer on the first conductive layer;

selectively etching portions of the hard mask layer to form first patterns of the hard mask layer and a second pattern of the hard mask layer;

forming a first shielding pattern that shields first portions of the first conductive layer exposed by the first patterns of the hard mask layer and opens second portions of the first conductive layer exposed by the second pattern of the hard mask layer;

selectively removing the second portions of the first conductive layer to form a first conductive line pattern;

forming a second shielding pattern that shields the first conductive line pattern and opens the first portions of the first conductive layer; and selectively removing the first portions of the first conductive layer to form second conductive line patterns of a higher density than the first conductive line pattern, wherein the first patterns of the hard mask layer cover the second conductive line patterns respectively.

* * * * *